(12) United States Patent
Osman

(10) Patent No.: US 8,054,137 B2
(45) Date of Patent: Nov. 8, 2011

(54) METHOD AND APPARATUS FOR INTEGRATING A FLL LOOP FILTER IN POLAR TRANSMITTERS

(75) Inventor: Saleh Osman, Cupertino, CA (US)

(73) Assignee: Panasonic Corporation, Osaka (JP)

( * ) Notice: Subject to any disclaimer, the term of this patent is extended or adjusted under 35 U.S.C. 154(b) by 238 days.

(21) Appl. No.: 12/481,378

(22) Filed: Jun. 9, 2009

(65) Prior Publication Data
US 2010/0308926 A1 Dec. 9, 2010

(51) Int. Cl.
*H03L 7/085* (2006.01)
(52) U.S. Cl. ............ 331/17; 331/23; 327/156; 332/127
(58) Field of Classification Search ............. 331/16, 331/17, 23; 327/147, 156; 332/119, 127, 332/128, 135, 136, 146; 375/374–376
See application file for complete search history.

(56) References Cited

U.S. PATENT DOCUMENTS

| | | | |
|---|---|---|---|
| 2,932,970 A * | 4/1960 | Zito .............................. | 73/304 C |
| 4,580,109 A * | 4/1986 | Lockwood .............. | 331/117 FE |
| 5,045,818 A | 9/1991 | Miura | |
| 5,164,685 A | 11/1992 | Niemiö | |
| 5,659,269 A | 8/1997 | Myers | |
| 5,710,524 A | 1/1998 | Chou et al. | |
| 5,867,333 A | 2/1999 | Saiki et al. | |
| 6,069,925 A | 5/2000 | Koh | |
| 6,172,536 B1 * | 1/2001 | Yoshihara ........................ | 327/87 |
| 6,339,711 B1 | 1/2002 | Otaka et al. | |
| 6,792,063 B1 * | 9/2004 | Ogura ............................. | 375/375 |
| 6,816,712 B2 | 11/2004 | Otaka et al. | |
| 6,856,204 B2 | 2/2005 | Kwon | |
| 6,892,057 B2 | 5/2005 | Nilsson | |
| 7,123,102 B2 | 10/2006 | Uozumi et al. | |
| 7,184,738 B2 | 2/2007 | Otaka et al. | |
| 7,301,407 B2 * | 11/2007 | Cho ............................. | 331/36 C |
| 7,420,426 B2 * | 9/2008 | Herrin et al. ................... | 331/1 A |
| 7,423,493 B2 | 9/2008 | Uozumi et al. | |
| 7,454,176 B2 | 11/2008 | Uozumi et al. | |
| 7,482,880 B2 * | 1/2009 | Herrin et al. ................... | 331/1 A |
| 7,495,518 B1 * | 2/2009 | Lee et al. ......................... | 331/16 |
| 7,541,879 B2 * | 6/2009 | Kato et al. ....................... | 331/16 |
| 7,636,386 B2 * | 12/2009 | McCune et al. .............. | 375/223 |
| 7,821,344 B2 * | 10/2010 | Kitayama et al. .............. | 331/16 |
| 2009/0108891 A1 * | 4/2009 | Sander et al. .................. | 327/156 |
| 2010/0102859 A1 * | 4/2010 | Fattaruso ...................... | 327/157 |

* cited by examiner

*Primary Examiner* — Robert Pascal
*Assistant Examiner* — Levi Gannon

(57) ABSTRACT

The invention relates to a method and apparatus for integrating the various circuit components controlling a voltage-controlled oscillator ("VCO") on an integrated circuit formed on a semiconductor device. In one embodiment, the integrated circuit includes a first digital-to-analog converter ("DAC") for receiving and converting a digital representation of the frequency modulation for the VCO to an analog form. A filter removes any conversion error from the first analog signal. A second DAC receives and converts a digital representation of the center frequency for the VCO to a second analog signal. The first and second analog signals are combined at an adder and the resulting signal is used by a bridge circuit which controls the VCO.

27 Claims, 8 Drawing Sheets

US 8,054,137 B2

METHOD AND APPARATUS FOR INTEGRATING A FLL LOOP FILTER IN POLAR TRANSMITTERS

BACKGROUND

1. Field

The present invention provides a method and apparatus for integrating a frequency-locked loop ("FLL") filter in polar transmitters.

2. Description of Related Art

Radio frequency ("RF") communication systems receive data in analog form. The received data is then converted to digital form prior to processing. On the transmission side, the digital data is converted to analog form and broadcasted through the RF communication system. Transmitting signals requires synthesizing many different frequencies, typically using a small number of reference frequencies. A phase-locked loop ("PLL") is used for this purpose.

A conventional PLL consists generally of three parts: a reference frequency input portion, a loop filter portion and a voltage-controlled oscillator ("VCO") portion. The reference frequency input portion includes a phase comparator and may include a frequency divider (which may be programmable). The phase comparator compares an output signal of the PLL with the reference frequency itself or the reference frequency divided down, thereby producing an error signal. The loop filter filters the error signal to produce a control signal that is applied to the VCO. During operation, the control signal drives the VCO in the proper direction so as to cause the error signal to be driven to zero or nearly zero.

PLLs generally operate in two different modes: an acquisition mode during which the PLL locks onto a particular frequency, and a tracking mode during which the PLL ensures that it remains locked. Both fast acquisition and accurate tracking are important design objectives. Unfortunately, these design objectives are generally conflicting. For fast acquisition, a wide loop bandwidth is desired. For accurate tracking, in the presence of modulation, a narrow loop bandwidth is desired. The disparity between the desired bandwidths in the two modes may be considerable.

For example, in cellular applications when changing channels, a wide loop bandwidth is desired to accomplish the frequency change as quickly as possible. When operating on a single channel, voice data having low frequency content is modulated onto a carrier signal. The PLL attempts in effect to cancel the modulation, which appears to the PLL as frequency drift. To accomplish slow modulation, therefore, a very narrow loop bandwidth is desired, such that the modulation is accomplished outside the PLL bandwidth.

Two-point modulation addresses this problem by providing a slow path and a fast path. The slow path has a low-pass response which sets the center frequency of the VCO. The fast path typically comprises a digital-to-analog converter ("DAC") and a low-pass filter which allows the baseband modulation to go through. However, conventional two-point modulation systems fail to provide an accurate control signal to the VCO because of the offset inherent in the digital-to-analog conversion devices.

In addition, the loop filter of a PLL circuit is composed of capacitive elements and resistive elements that are not part of the integrated circuits ("ICs"). This is because capacitive elements with requisite capacitance consume a large footprint on the IC. Decreasing the capacitance footprint requires increasing the resistances of the resistive elements. However, such approach increases the thermal noise created by the resistive elements.

In the PLL circuit, the voltage from the loop filter is directly applied to the control terminal of the VCO. Therefore, if the thermal noise of the passive elements, which define the loop filter, and external noise intrusion are high and the control sensitivity of the VCO is high, this will deteriorate VCO output phase noise.

Therefore, there is a need for an improved method and apparatus to provide center frequency and baseband modulation signal to the VCO substantially free of noise while forming the entire circuit on an a small, integrated, solid state semiconductor device.

SUMMARY

In one embodiment, the disclosure relates to an apparatus for providing an integrated circuit for controlling a voltage-controlled oscillator ("VCO"). The integrated circuit includes a first digital-to-analog converter ("DAC") for receiving first digital data representing a modulation frequency for the VCO. The first DAC converts the first digital data to a first analog signal having a signal component and a conversion error component. A filter removes the conversion error component from the first analog signal and forms a first filtered analog signal. A second DAC receives second digital data which defines the center frequency for the VCO. The second DAC converts the second digital data to a second analog signal. An adder (interchangeably, a summer) combines the first filtered analog signal and the second analog signal to form a combined output signal. Finally, a bridge circuit receives the combined output signal and produces a capacitance value that is a variable function of the input signal. The capacitance value is used to control the VCO. In a preferred embodiment of the disclosure, this circuit is formed on a solid state semiconductor chip as an integrated circuit.

In another embodiment, the disclosure relates to a method for controlling a VCO by providing a control circuit integrated into a semiconductor chip. The method includes the steps of: (i) receiving first digital data defining a modulation frequency at the IC; (ii) receiving second digital data defining a center frequency at the IC; (iii) converting the first digital data to an analog signal having an offset component and a signal component; (iv) converting the second digital data to an analog center frequency signal; (v) removing the offset component from the analog signal to provide an analog modulation frequency signal; (vi) combining the analog center frequency signal and the analog modulation frequency signal to form a control signal; and (vii) tuning the control signal at a bridge circuit and providing a tuned control signal to the VCO.

In still another embodiment, the disclosure relates to an integrated circuit formed on a semiconductor device. The semiconductor device has formed thereon a parser circuit for receiving an incoming digital data stream and separating the incoming data stream to a first digital signal and a second digital signal. The first digital signal defines the center frequency for the VCO plus a lower frequency portion of the modulation frequency band, and the second digital signal defines the remaining upper portion of the modulation frequency band for the VCO. A first switch circuit receives and converts the first digital signal to a first analog signal. A DAC receives and converts the second digital signal to a second analog signal. The second analog signal contains signal and offset components. A filter removes the offset component of the second analog signal and provides a filtered analog signal. The resulting filtered signal is then combined with the first analog signal in an adder and a summed signal is directed to a bridge circuit which controls the VCO. In this embodiment, the parser, the first and second switch circuit, the DAC, the adder and the filter define an integrated circuit which is formed on a solid state semiconductor device.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

The disclosure provides a method and apparatus for combining the fast-path (modulation frequency) and slow-path (center frequency) modulation signals into one IC. Conventional circuits are implemented with discrete components on a circuit board. This renders conventional circuits inefficient as it is costly and consumes substantial circuit footprint. The two-point modulation system requires two filters that are instrumental in setting the loop-bandwidth and VCO's transient dynamics. The position of the filter components on the printed circuit board ("PCB") and proximity to the VCO tune line are important to the FLL fidelity. The disclosure addresses these concerns by providing an IC which contains both filters on the same chip, proximal to the VCO tune line and reduced input/output ("I/O") count.

Figure 1:
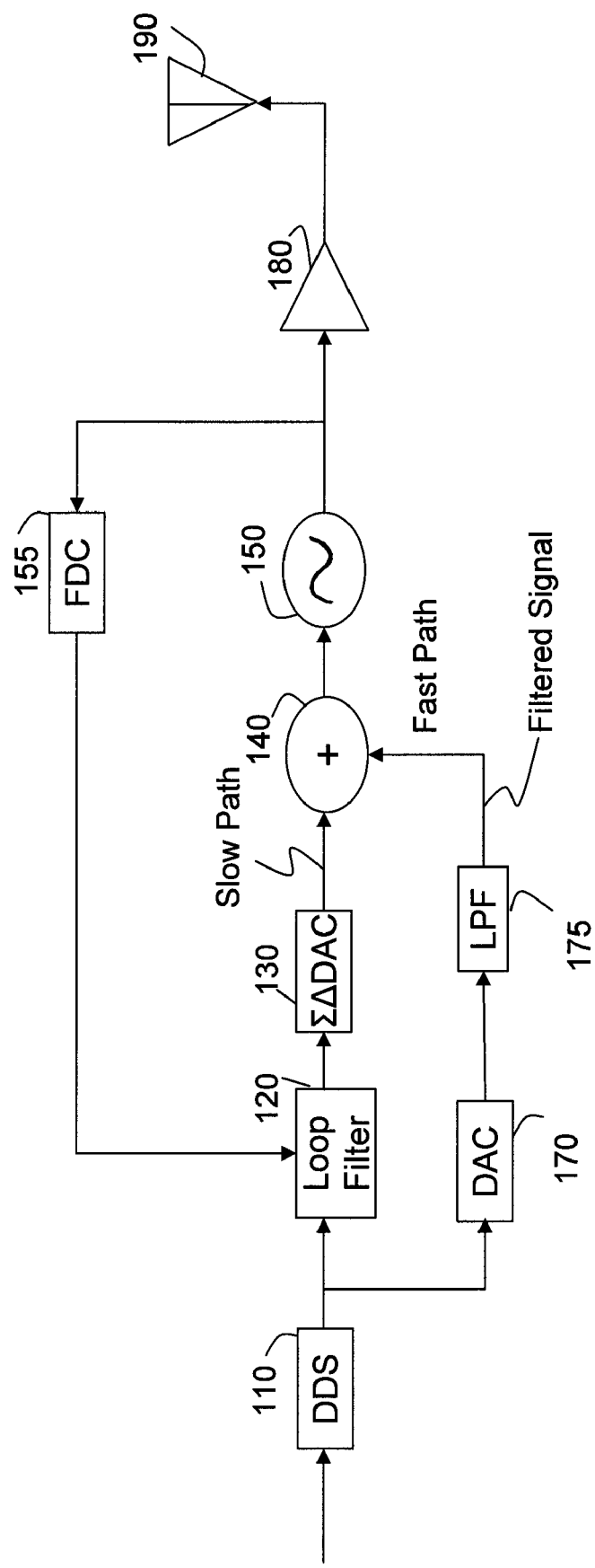
FIG. 1 shows a conventional two-point modulation FLL for a polar transmitter.

FIG. 1 shows a conventional two-point modulation FLL for a polar transmitter. In FIG. 1, a direct digital synthesizer ("DDS") 110 generates a digital representation of a desired signal using logic circuitry and/or digital computer. The slow-path signal is directed through a frequency-locked loop ("FLL") 120 to a sigma-delta digital-to-analog converter ("ΣΔDAC") 130 while the fast-path frequency is directed through DAC 170 and lowpass filter 175.

Analog output signals from the ΣΔDAC 130 and the DAC 170 are combined at an adder 140 and are fed into a VCO 150. The ΣΔDAC 130 sets the modulation frequency and the DAC 170 sets the baseband (center) frequency for the VCO 150. The output of the VCO 150 is amplified by an amplifier 180 and transmitted through an antenna 190. The VCO output is also processed through a frequency-to-digital converter ("FDC") 155 and fed back to the FLL 120. A consistent problem with the conventional system of FIG. 1 is the mismatch and offset errors created when converting the digital-to-analog signal at DAC 170. Another problem is that the fast-path is designed off the main chip and thereby consumes additional chip I/O interface circuits, package pins and PCB footprint.

Figure 2:
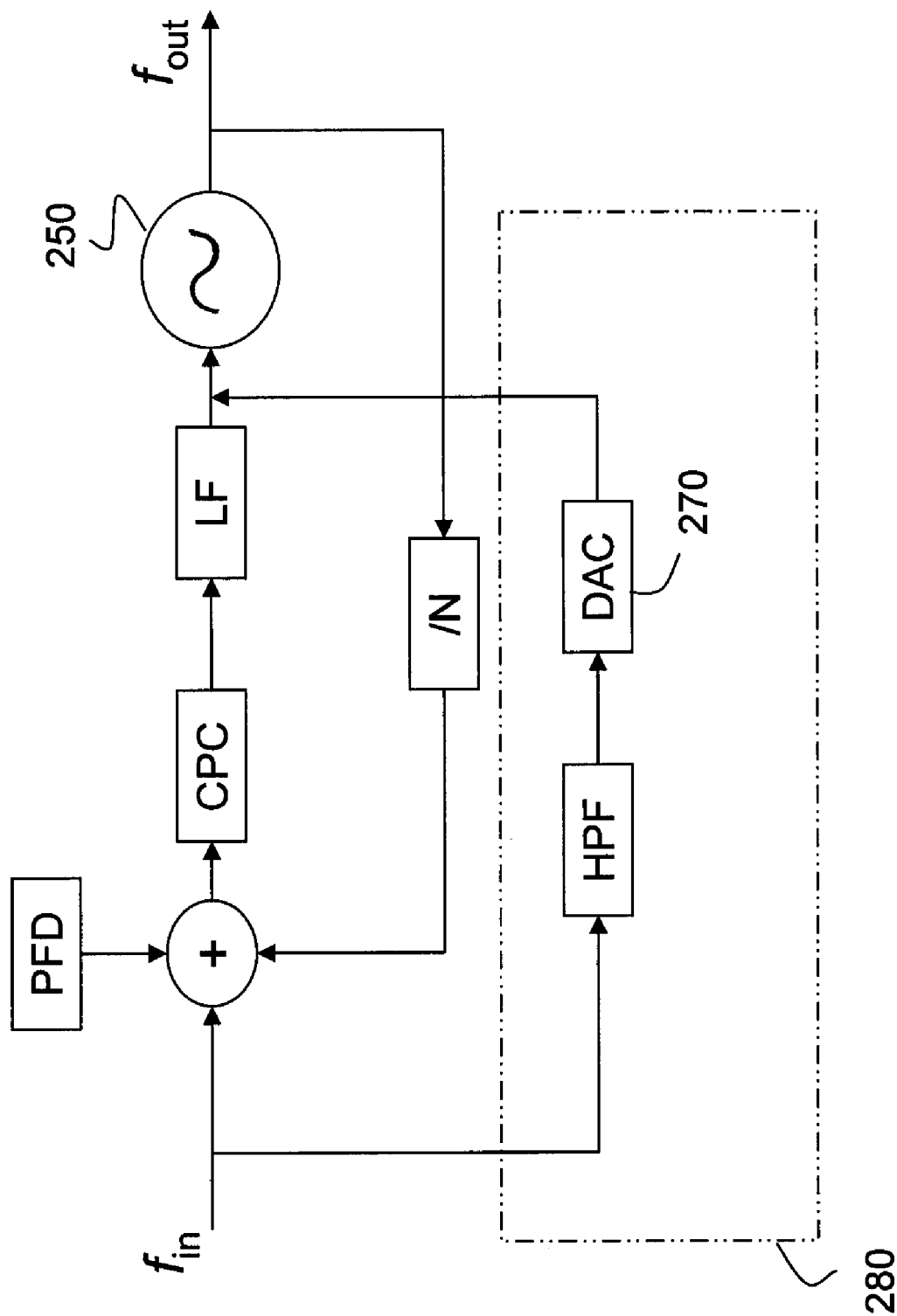
FIG. 2 is a schematic representation of a conventional phase-locked loop.

FIG. 2 is a schematic representation of a conventional phase-locked loop. As shown, the VCO 250 is controlled, among others, by the output signal of the DAC 270. Conventional design device circuit 280 is on a separate PCB other than the main PLL circuit. Such arrangement consumes additional circuit footprint.

Figure 3:
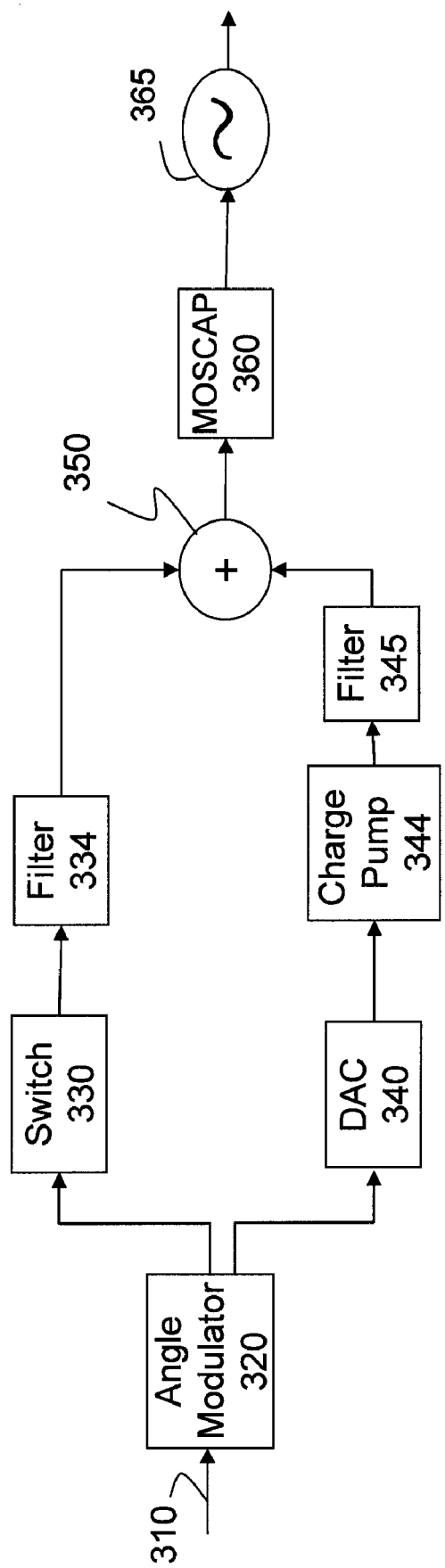
FIG. 3 is a schematic diagram showing a VCO controlling circuit using a digital-to-analog converter and a switching circuit according to an embodiment of the disclosure.

FIG. 3 is a schematic circuit diagram showing a VCO controlling circuit using a digital-to-analog converter and a switching circuit according to one embodiment of the disclosure. An incoming signal 310 comprises a digital data stream having both modulation and center frequency data. The incoming signal 310 can also be considered a digital bus capable of receiving both frequency and modulation data. In one embodiment, a digital data stream 310 defines a sequence of digital words of one byte in length.

An angle modulator 320 can comprise a direct digital synthesizer ("DDS") and error signal generator units connected in series. The angle modulator 320 may include CMOS logic circuits. The angle modulator 320 may separate bits from an incoming digital word. The separated bits define the center frequency while the remaining bits of the digital word can define a modulation frequency. The angle modulator 320 includes both frequency and phase.

The information containing center frequency (i.e., one bit digital data) is directed to a switch 330 in the form of a series of pulses. The switch 330 can define a conventional switching module capable of switching between two or more levels. Each pulse contains static information and provides a pulse density. Thus, over a period of time a trend can be discerned as to the long term average of the pulse densities. This trend can be used to determine whether to increase or decrease the center frequency in conjunction with a filter 334 which grades the incoming signal. Filter 334 can define a loop filter or any other filters configured to remove signal offset or harmonics associated with the signal. According to one embodiment of the invention, the analog center frequency is filtered to provide a gain-controlled analog center frequency.

The digital data stream containing the modulation frequency is directed to a DAC 340 for digital-to-analog conversion. The resulting analog signal is directed to a charge pump 344. The charge pump 344 can comprise a plurality of current sources which define a continuous time filter for charging the signal. The charge pump 344 can optionally be used along with a filter 345 for removing conversion errors or other harmonics from the signal. The filter 345 can define a loop filter. The filtered signals containing the center frequency information and the modulation frequency information are combined at an adder 350 and the resulting signal is directed to a metal-oxide silicon capacitor ("MOSCAP") 360 to provide a control signal for a VCO 365. The embodiment of FIG. 3 can be implemented on an IC and fabricated on a semiconductor chip. Moreover, the control signal is substantially free of offset components and other harmonics which compromise an accurate control of the VCO.

Figure 4:
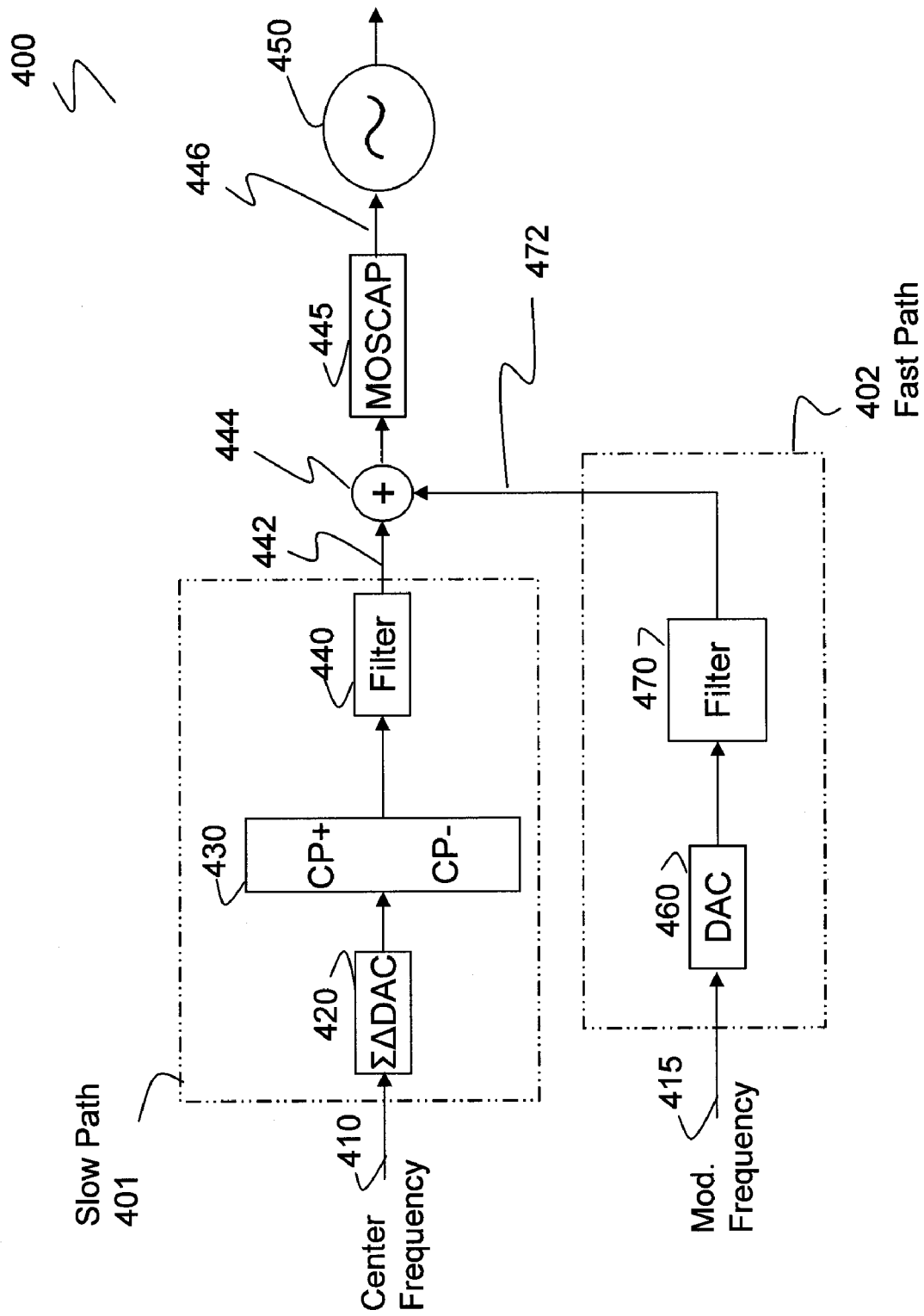
FIG. 4 is a schematic diagram of a VCO control circuit according to another embodiment of the disclosure.

FIG. 4 is a schematic diagram of a VCO control circuit according to another embodiment of the disclosure. A circuit 400 defines a slow path 401 and a fast path 402. The circuit 400 receives digital inputs 410 and 415. The input 410 provides the center frequency channel for a VCO 450 and the input 415 provides the modulation frequency for the VCO 450. The ΣΔDAC 420 receives the input 410 and converts the incoming digital data into analog data suitable for controlling the VCO 450. In one embodiment, at least one of the ΣΔDAC 420 or the DAC 460 receives a digital data representing phase modulation and converts the digital data into an analog representation of the phase modulation. The output of the ΣΔDAC 420 is directed to a charge pump 430. The charge pump 430 comprises a conventional charge pump, including a pump-up (CP+) section, which acts as a current source, and a pump-down (CP−) section which acts as a drain source. The filter 440 receives and smoothes the output of the charge pump 430. In one embodiment, the filter 440 comprises a resistor-capacitor ("RC") circuit having two capacitors in parallel. The filter 440 may optionally comprise a loop filter.

The digital data stream 415 is directed to a DAC 460. As in the exemplary embodiment of FIG. 3, the digital data stream 415 can comprise a digital signal with multiple bits of information. The DAC 460 converts the digital signal 415 to an analog signal and directs the analog signal to a filter 470. In one embodiment, the filter 470 includes active components for removing signal offset from the input signal.

The adder 444 receives analog signals 442 and 472 and combines them into an analog signal which is then fed to a MOSCAP 445. The MOSCAP 445 can be arranged as a bridge circuit for modulating the VCO's control signal. The control signal 446 can be used to drive the VCO 450. The filter 470 removes the offset component and any other conversion errors from the analog signal output of the DAC 460. Consequently, the control signal 446 is substantially error free. Moreover, components of the circuit 400 can be formed as an integrated solid state IC chip, thereby reducing a circuit footprint as well as the manufacturing cost.

Figure 5:
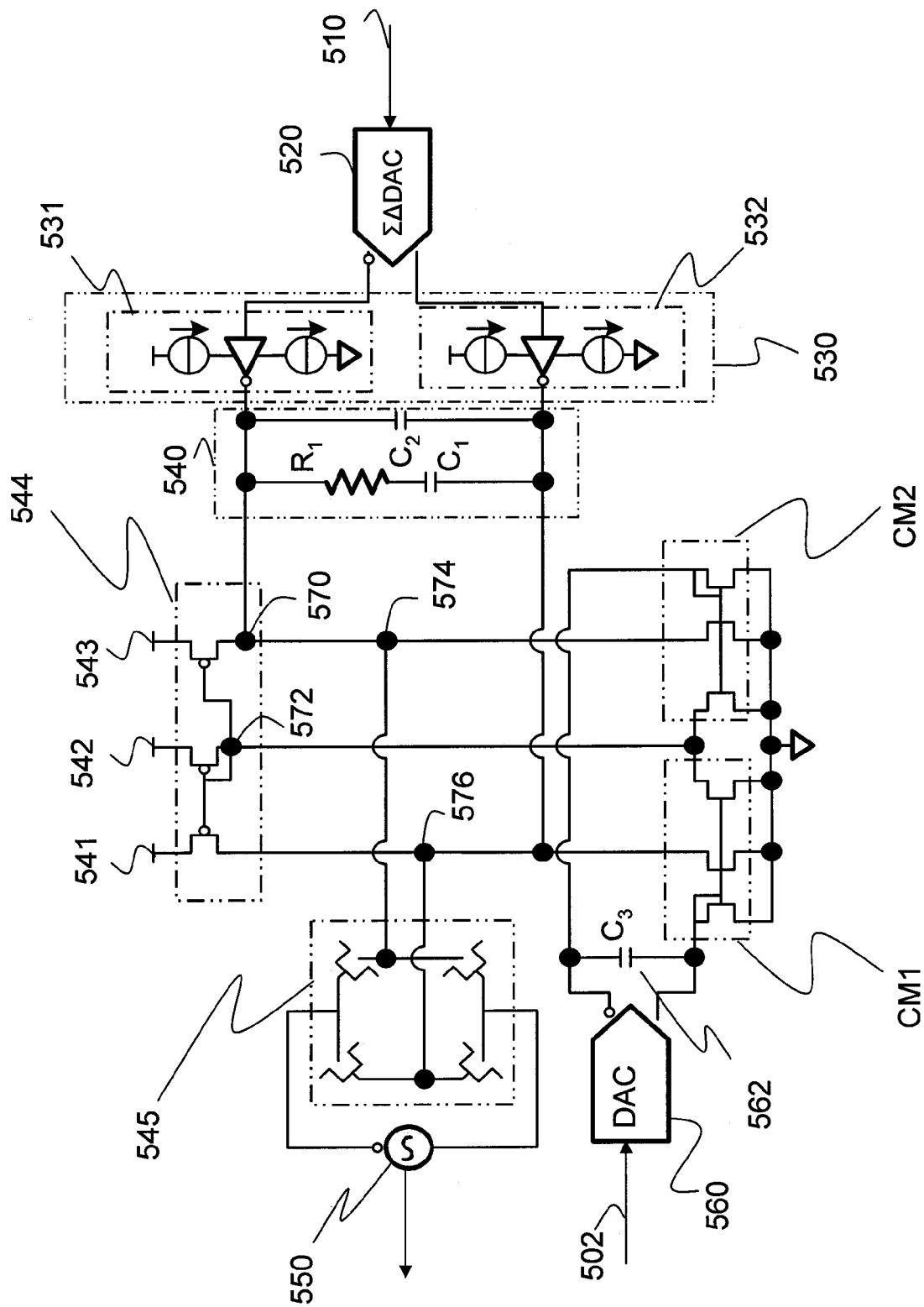
FIG. 5 is an IC circuit layout for implementing one embodiment of the architecture of FIG. 4.

FIG. 5 is an exemplary IC circuit layout for implementing the architecture of FIG. 4. As stated, one advantage of the invention is the ability to form a single IC implementing the entire circuit of FIG. 4. In the circuit of FIG. 5, digital data 510 is provided to a ΔDAC 520. As discussed with reference to FIG. 4, the ΣΔDAC 420 defines the slow-path phase of the circuit. Digital data 510 can determine the center frequency for the VCO 550.

The analog output of the ΣΔDAC 520 is directed to a charge pump 531 (CP+) and a charge pump 532 (CP−). A loop filter 540 receives outputs of the charge pumps 531 and 532. The loop filter 540 includes two capacitors connected in parallel and a resistor to remove the offset component from the input signal. The output of the loop filter 540 is directed to an adder 544.

Data (e.g., bits of information) 502 contain the digital data stream defining the modulation frequency for the VCO 550. The digital data stream is converted through a DAC 560 to an analog signal and is processed through a capacitor 562 ($C_3$) to current mirrors CM1 and CM2. The capacitor 562 can be optionally used to suppress switching transients. The current mirrors CM1 and CM2 work as a filter for the output of the DAC 560 by removing the offset signal or line jitters. The current mirrors can be used as differential switching pairs. The current mirrors CM1 and CM2 copy a current through several active devices by controlling the current in another device of a circuit while maintaining the output current constant regardless of the loading. Here, the current being copied is a varying signal current.

The resulting signal from the current mirrors CM1 and CM2 is directed to the adder 544. The adder 544 is shown as three p-type transistors 541, 542 and 543 connected together. The source electrode of the transistor 543 is connected to the output of the loop filter 540 at node 570. Thus, the adder 544 receives a first input at node 570. The first input can be the analog signal from the ΣΔDAC 520 defining the center frequency for the VCO 550. The adder 544 also receives a second input at node 572 which controls the gates of the transistors 541, 542 and 543. The second input can be an analog signal from the DAC 560 defining the modulation frequency for the VCO 550.

The adder 544 signals the MOSCAP 545 through node 574 and node 576. The MOSCAP 545 shows four metal oxide capacitors arranged to form a bridge circuit. The MOSCAP 545 is energized through nodes 574 and 576 with outputs from the adder 544 providing a control voltage to the VCO 550.

Figure 6A:
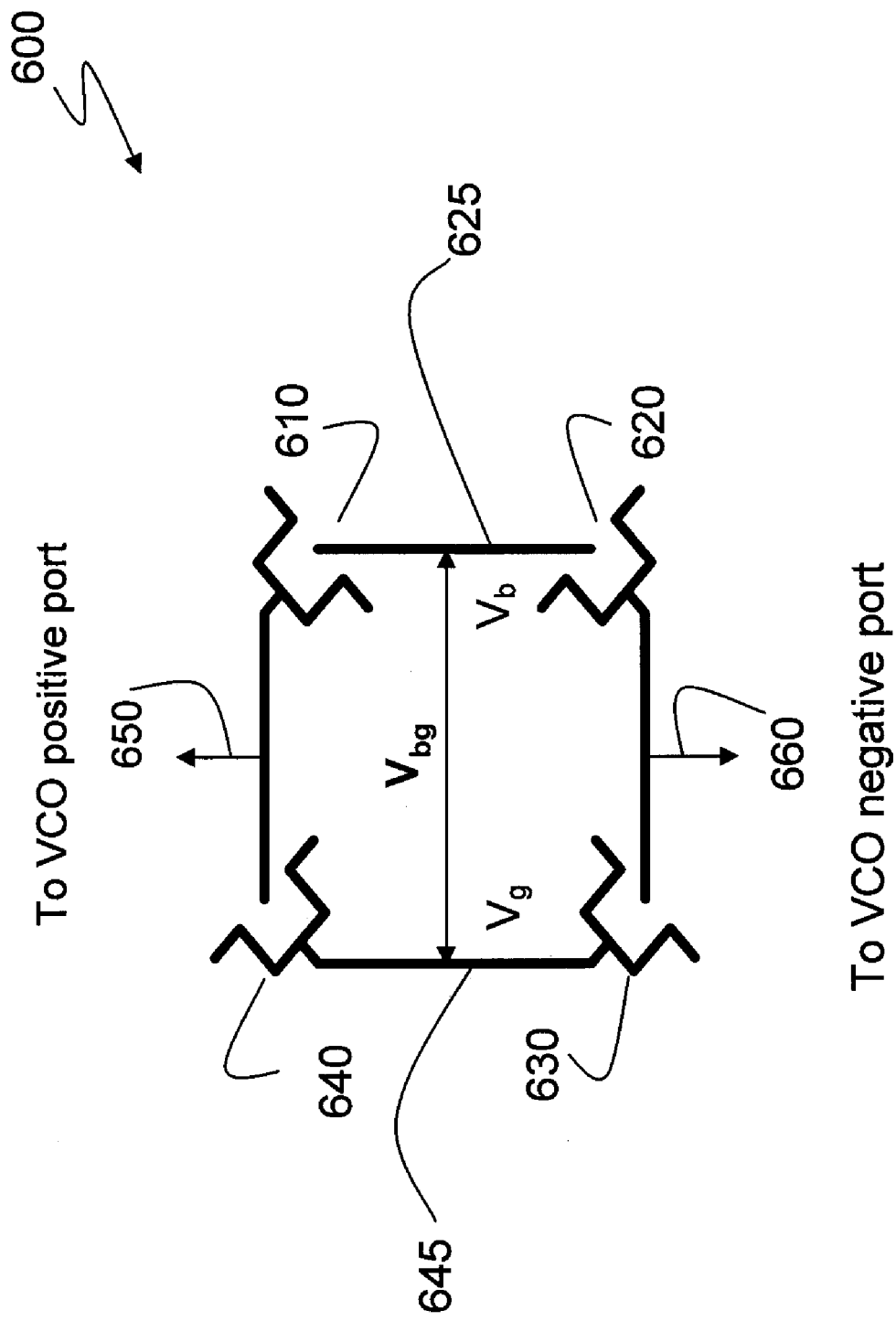
FIG. 6A shows differential metal-oxide silicon capacitors arranged in a bridge configuration according to one embodiment of the disclosure.

FIG. 6A shows differential metal-oxide silicon capacitors arranged in a bridge according to one embodiment of the disclosure. The MOSCAP 600 comprises four n-type transistors 610, 620, 630 and 640 formed as a bridge circuit. While FIG. 6A shows n-type transistors used for bridge circuit 600, the disclosure is not limited thereto and p-type transistors or any combination of p-type and n-type transistors can be used to form the desired bridge circuit without departing from the disclosed principals.

In FIG. 6A, the differential MOS capacitors are arranged as a bridge circuit for modulation and to reduce control signal $V_g$ 645 and $V_b$ 625 at the gate and bulk reference to circuit ground, respectively. The voltage difference between gate voltage 645 ($V_g$) and bulk voltage ($V_b$) 625 is identified as $V_{bg}$ (interchangeably, $V_{gb}$) in FIG. 6A. Rail 650 of the bridge circuit defines the input to a VCP's positive port while rail 660 of the bridge circuit defines the input to the VCO's negative port.

In an embodiment of the disclosure, all capacitors can be biased in accumulation mode (AMOS) which results in a uniform tuning curve. In another embodiment, half of the MOS capacitors can be operated in the accumulation mode (AMOS) and the other half can be operated in inversion mode (IMOS) with respect to bulk to gate potential voltage $V_{bg}$. This configuration results in an abrupt or steep tuning slope.

Figure 6B:
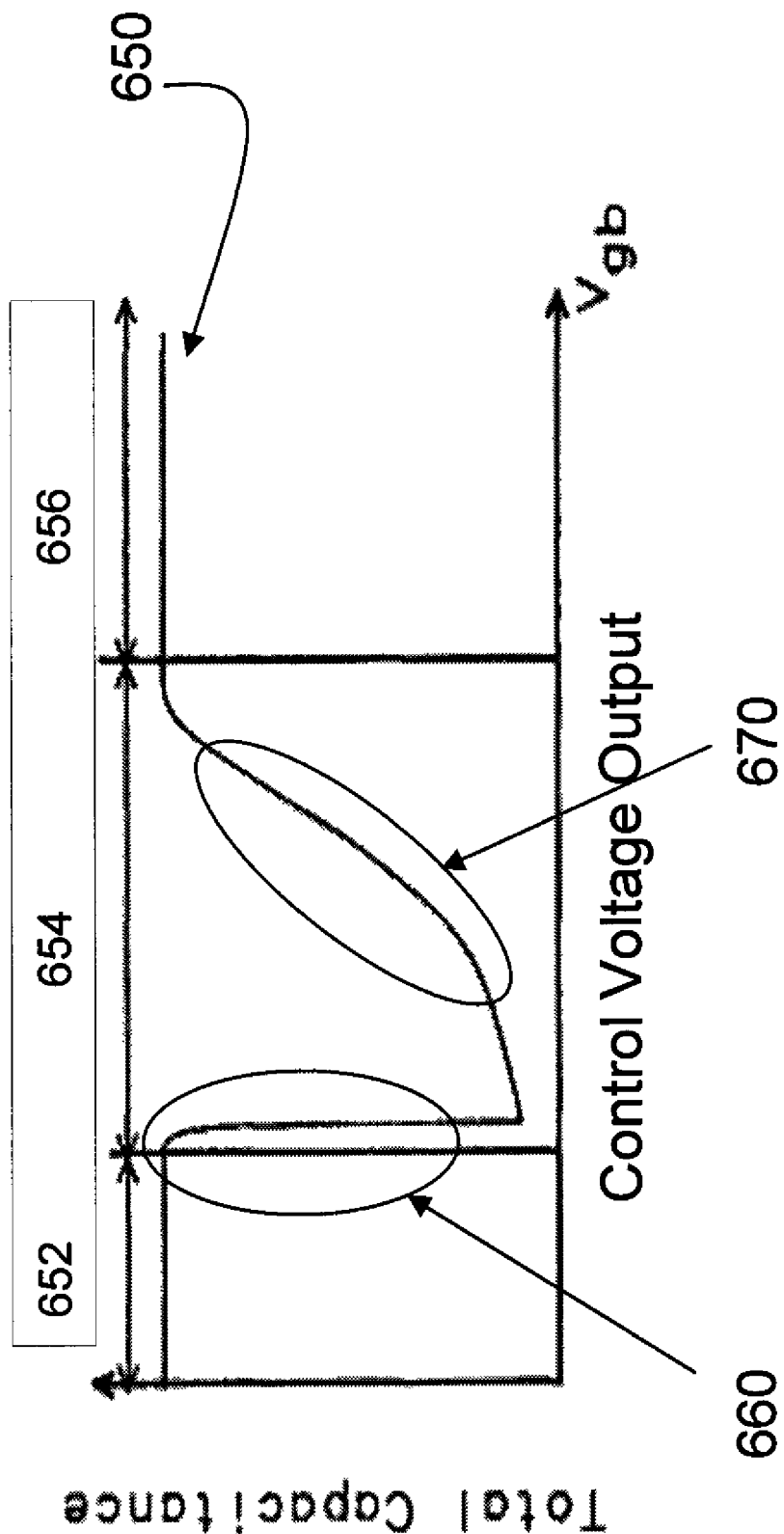
FIG. 6B shows the relationship between total capacitance and the control voltage output for MOSCAP bridge circuit of FIG. 6A according to one embodiment of the disclosure.

FIG. 6B shows the relationship between total capacitance and the control voltage output for the MOSCAP bridge circuit of FIG. 6A. As stated, the output of the MOSCAP bridge circuit 600 is used to tune the VCO (see FIG. 5). For fine-tuning the VCO, the capacitance-voltage ratio should be defined by a line having a small slope. In contrast, a capacitance-voltage ratio defined by a steep slope provides for coarse tuning of the VCO. In FIG. 6B, the slope 660 provides for coarse tuning of the VCO 600 as it is characterized by an inversion mode (IMOS) relationship between total capacitance and control voltage. On the other hand, the slope 670 is representative of an accumulation mode (AMOS) as the slope defining the ratio of total capacitance and the voltage is relatively higher. Thus, for a wider modulation such as defining the center frequency, a slope similar to the accumulation mode 670 can be used. For a coarser modulation, such as defining the modulation frequency, the inversion mode 660 can be used.

The curve 650 of FIG. 6B is divided into several regions. Region 652 defines the triode region which indicates a flat capacitance to voltage ratio. Region 654 shows the saturation point for bridge circuit 600 (see FIG. 6A). This region includes the IMOS and AMOS curves for controlling the center frequency and the modulation frequency of a VCO. Region 656 is the cutoff region where the capacitance of the bridge circuit does not change with increased voltage. Region 670 mid point also defines the slow path operating point which is implemented through the ΣΔDAC (see FIGS. 4 and 5).

Figure 7:
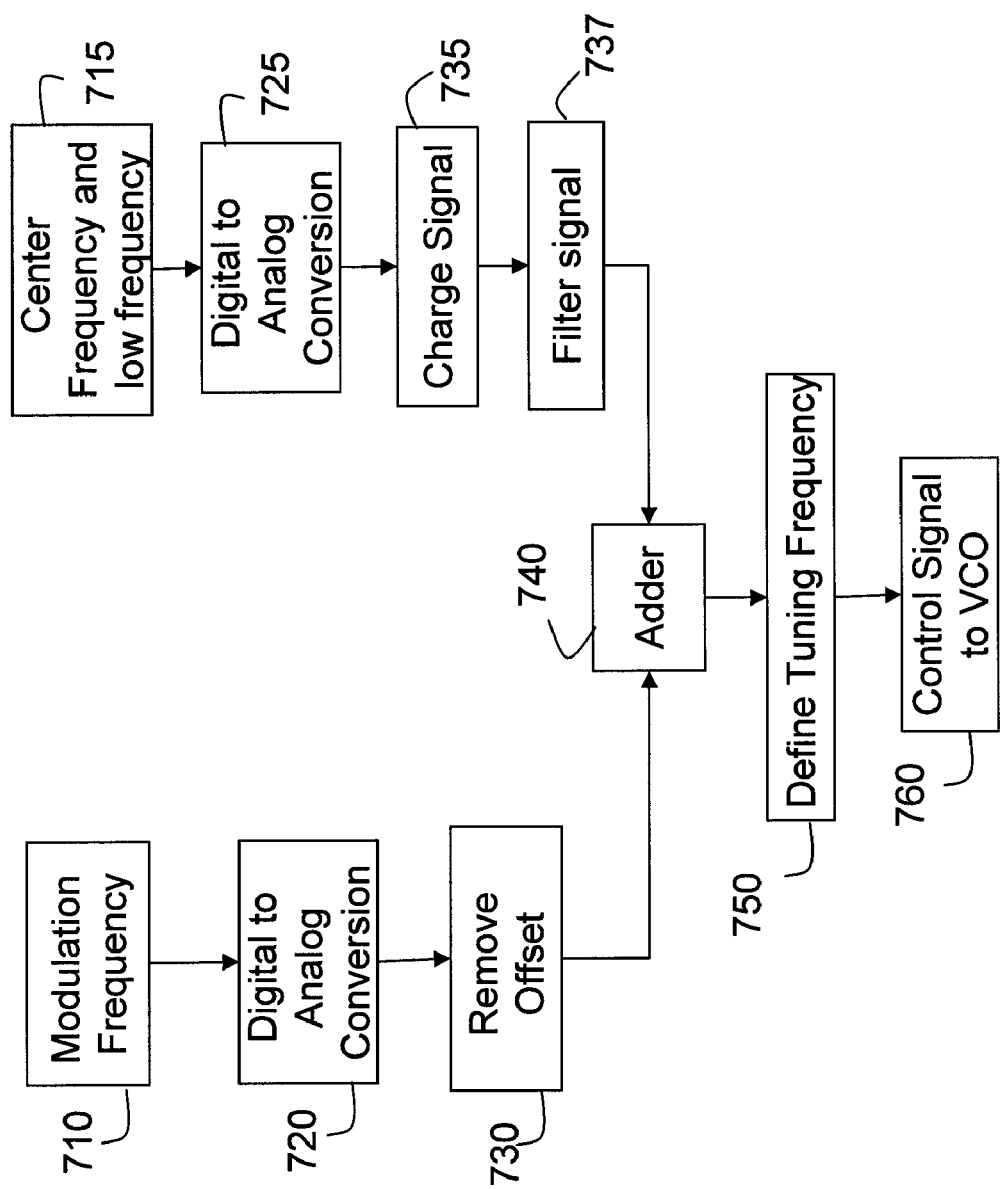
FIG. 7 is a schematic flow diagram showing a method for controlling a VCO according to an embodiment of the disclosure.

FIG. 7 is a schematic flow diagram showing a method for controlling a VCO according to an embodiment of the disclosure. In step 710, a first digital data stream representing modulation frequency is received and converted to an analog waveform in step 720. The analog waveform of step 720 contains a signal component and an offset component. In step 730, the offset component is removed from the analog signal.

A second digital data stream containing the center frequency is provided at step 715. The second digital data stream contains the center frequency and the low frequency portion of modulation signal. The first and second digital data streams can be provided from a data bus and separated into two data streams. In step 725, the digital data stream containing the center frequency is converted into an analog data signal. In step 735, the analog signal containing the signal voltage is amplified through one or more charge pumps. The charge pump can have a first pump-up current source connected to inject current into the circuit node, and a second pump-down current source connected to withdraw current from the same node. In step 737, the signal is filtered to form a filtered analog signal containing the center frequency for the VCO.

The signals containing the center frequency and the modulation frequency are added in step 740 and the resulting signal is used to define a tuning frequency at step 750. The output of step 750 can be used to control a VCO, as shown in step 760.

While the principles of the disclosure have been illustrated in relation to the exemplary embodiments shown herein, the principles of the disclosure are not limited thereto and include any modification, variation or permutation thereof.

What is claimed is:

1. An integrated circuit for controlling a voltage-controlled oscillator ("VCO"), the integrated circuit comprising:
   a first digital-to-analog converter (DAC) receiving a first digital data representing a modulation frequency for the VCO, the DAC converting the first digital data to a first analog signal having a signal component and a conversion error component;
   a filter removing the conversion error component from the first analog signal to form a first filtered analog signal;
   a second DAC receiving a second digital data representing a center frequency and converting the second digital data to a second analog signal;
   a summer combining the first filtered analog signal and the second analog signal to form a combined output signal, the combined output signal defining the center frequency and the modulation frequency for the VCO; and
   a bridge circuit receiving the combined output signal and producing a capacitance value that is a variable function of an input signal, the capacitance value controlling the VCO by using a capacitance-voltage characteristic having two different slopes;
   wherein the integrated circuit defines a solid-state device.

2. The integrated circuit of claim 1, wherein the filter is a continuous time filter.

3. The integrated circuit of claim 1, wherein at least one of the first or the second DAC defines a ΣΔDAC.

4. The integrated circuit of claim 1, wherein at least one of the first DAC or the second DAC receives a digital data representing phase modulation and converts the digital data into an analog representation of the phase modulation.

5. The integrated circuit of claim 1, wherein the second digital data defines a bit.

6. The integrated circuit of claim 1, further comprising a second filter for filtering an analog frequency signal.

7. The integrated circuit of claim 1, wherein the VCO is tuned to a center frequency by a first ratio of capacitance to voltage and is tuned to a modulation frequency by a second ratio of capacitance to voltage, wherein the first ratio of capacitance to voltage provides a smaller slope than the second ratio of capacitance to voltage.

8. An integrated circuit for controlling a voltage-controlled oscillator ("VCO"), the integrated circuit comprising:
   a first digital-to-analog converter (DAC) receiving a first digital data representing a modulation frequency for the VCO, the DAC converting the first digital data to a first analog signal having a signal component and a conversion error component;
   a filter removing the conversion error component from the first analog signal to form a first filtered analog signal;
   a second DAC receiving a second digital data representing a center frequency and converting the second digital data to a second analog signal;
   a summer combining the first filtered analog signal and the second analog signal to form a combined output signal, the combined output signal defining the center frequency and the modulation frequency for the VCO;
   a bridge circuit receiving the combined output signal and producing a capacitance value that is a variable function of an input signal, the capacitance value controlling the VCO; and
   a plurality of current sources for amplifying the second analog signal, wherein the integrated circuit defines a solid-state device.

9. A method for controlling a voltage-controlled oscillator ("VCO") on an integrated circuit ("IC"), the method comprising:
   receiving first digital data defining a modulation frequency at the IC;
   receiving second digital data defining a center frequency at the IC;
   converting, using the IC, the first digital data to an analog signal having an offset component and a signal component;
   converting, using the IC, the second digital data to an analog center frequency signal;
   removing, using the IC, the offset component from the analog signal to provide an analog modulation frequency signal;
   combining, using the IC, the analog center frequency signal and the analog modulation frequency signal to form a control signal;
   tuning the control signal at a bridge circuit; and
   providing a tuned control signal to the VCO by using a capacitance-voltage characteristic having two different slopes.

10. The method of claim 9, further comprising filtering the analog center frequency to provide a gain-controlled analog center frequency.

11. The method of claim 9, further comprising filtering the analog center frequency signal to remove a harmonic signal.

12. The method of claim 9, wherein the step of tuning the control signal at the bridge circuit further comprises charging and discharging a leg of the bridge circuit with the control signal.

13. The method of claim 9, wherein the VCO is tuned to a center frequency by a first ratio of capacitance to voltage and is tuned to a modulation frequency by a second ratio of capacitance to voltage, wherein the first ratio of capacitance to voltage provides a smaller slope than the second ratio of capacitance to voltage.

14. A method for controlling a voltage-controlled oscillator (VCO) on an integrated circuit ("IC"), the method comprising:
   receiving the first digital data defining a modulation frequency at the IC;
   receiving second digital data defining a center frequency at the IC;

converting, using the IC, the first digital data to an analog signal having an offset component and a signal component;

converting, using the IC, the second digital data to an analog center frequency signal;

removing, using the IC, the offset component from the analog signal to provide an analog modulation frequency signal;

combining, using the IC, the analog center frequency signal and the analog modulation frequency signal to form a control signal tuning the control signal at a bridge circuit;

providing a tuned control signal to the VCO; and processing a gain for the analog center frequency signal at a plurality of charge pump circuits.

15. A semiconductor integrated circuit device, comprising:

a parser circuit receiving an incoming digital data stream and separating the incoming data stream to a first digital signal and a second digital signal, the first digital signal defining a modulation frequency for a VCO and the second digital signal defining a center frequency for the VCO;

a digital-to-analog converter (DAC) for converting the first digital signal to a first analog signal, the first analog signal having a signal component and an offset component;

a first switch circuit for converting the second digital signal to a second analog signal;

a filter for removing the offset component from the first analog signal to provide a filtered analog signal;

a summer for combining the filtered analog signal with the second analog signal to form a combined signal; and a second switch circuit for receiving and tuning the combined signal to control the VCO by using a capacitance-voltage characteristic having two different slopes;

wherein the parser circuit, the first and second switch circuit, the DAC, the adder and the filter define an integrated circuit and are integrated on a solid-state semiconductor device.

16. The semiconductor integrated circuit device of claim 15, wherein the parser circuit separates a bit from each digital byte.

17. The semiconductor integrated circuit device of claim 15, wherein the first switch circuit further comprises a DAC.

18. The semiconductor integrated circuit device of claim 15, wherein the first switch circuit further comprises a ΣΔDAC.

19. The semiconductor integrated circuit device of claim 15, wherein the second switch circuit is a MOSCAP bridge circuit.

20. The semiconductor integrated circuit device of claim 19, wherein the MOSCAP bridge circuit comprises at least one of an IMOS capacitor or an AMOS capacitor.

21. The semiconductor integrated circuit device of claim 15, wherein the filter defines a loop filter.

22. The semiconductor integrated circuit device of claim 15, wherein the summer further comprises a plurality of p-type transistors connected in series.

23. The semiconductor integrated circuit device of claim 15, wherein the VCO is tuned to a center frequency by a first ratio of capacitance to voltage and is tuned to a modulation frequency by a second ratio of capacitance to voltage, wherein the first ratio of capacitance to voltage provides a smaller slope than the second ratio of capacitance to voltage.

24. A semiconductor integrated circuit device comprising:

a parser circuit receiving an incoming digital data stream and separating the incoming data stream to a first digital signal and a second digital signal, the first digital signal defining a modulation frequency for a VCO and the second digital signal defining a center frequency for the VCO;

a digital-to-analog converter (DAC) for converting the first digital signal to a first analog signal, the first analog signal having a signal component and an offset component;

a first switch circuit for converting the second digital signal to a second analog signal;

a filter for removing the offset component from the first analog signal to provide a filtered analog signal;

a summer for combining the filtered analog signal with the second analog signal to form a combined signal;

a second switch circuit for receiving and tuning the combined signal to control the VCO; and wherein the parser circuit, the first and second switch circuit, the DAC, the adder and the filter define an integrated circuit and are integrated on a solid-state semiconductor device, wherein the first switch circuit comprises a DAC and a charge pump.

25. The semiconductor integrated circuit device of claim 24, wherein the first switch circuit further comprises a loop filter.

26. A semiconductor integrated circuit device, comprising:

a parser circuit receiving an incoming digital data stream and separating the incoming data stream to a first digital signal and a second digital signal, the first digital signal defining a modulation frequency for a VCO and the second digital signal defining a center frequency for the VCO;

a digital-to-analog converter (DAC) for converting the first digital signal to a first analog signal, the first analog signal having a signal component and an offset component;

a first switch circuit for converting the second digital signal to a second analog signal;

a filter for removing the offset component from the first analog signal to provide a filtered analog signal;

a summer for combining the filtered analog signal with the second analog signal to form a combined signal;

a second switch circuit for receiving and tuning the combined signal to control the VCO; and a charge pump for charging the first analog signal, wherein the parser circuit, the first and second switch circuit, the DAC, the adder and the filter define an integrated circuit and are integrated on a solid-state semiconductor device.

27. A semiconductor integrated circuit device comprising:

a parser circuit receiving an incoming digital data stream and separating the incoming data stream to a first digital signal and a second digital signal, the first digital signal defining a modulation frequency for a VCO and the second digital signal defining a center frequency for the VCO;

a digital-to-analog converter (DAC) for converting the first digital signal to a first analog signal, the first analog signal having a signal component and an offset component;

a first switch circuit for converting the second digital signal to a second analog signal;

a filter for removing the offset component from the first analog signal to provide a filtered analog signal;

a summer for combining the filtered analog signal with the second analog signal to form a combined signal;

a second switch circuit for receiving and tuning the combined signal to control the VCO;

wherein the parser circuit, the first and second switch circuit, the DAC, the adder and the filter define an integrated circuit and are integrated on a solid-state semiconductor device; and wherein the filter further comprises a plurality of current mirrors.

* * * * *

UNITED STATES PATENT AND TRADEMARK OFFICE
CERTIFICATE OF CORRECTION

PATENT NO. : 8,054,137 B2  
APPLICATION NO. : 12/481378  
DATED : November 8, 2011  
INVENTOR(S) : Saleh Osman Page 1 of 1

It is certified that error appears in the above-identified patent and that said Letters Patent is hereby corrected as shown below:

Claim 14, Col. 8, line 62: "(VCO")" should read --("VCO")--.

Signed and Sealed this  
Twenty-first Day of February, 2012

David J. Kappos  
*Director of the United States Patent and Trademark Office*